(12) United States Patent
Reznik et al.

(10) Patent No.: US 7,306,466 B2
(45) Date of Patent: Dec. 11, 2007

(54) ELECTRICAL PRINTED CIRCUIT BOARD

(75) Inventors: Daniel Reznik, Berlin (DE); Mario Festag, Berlin (DE)

(73) Assignee: Finisar Corporation, Sunnyvale, CA (US)

( * ) Notice: Subject to any disclaimer, the term of this patent is extended or adjusted under 35 U.S.C. 154(b) by 432 days.

(21) Appl. No.: 11/009,640

(22) Filed: Dec. 10, 2004

(65) Prior Publication Data

US 2006/0126317 A1  Jun. 15, 2006

(51) Int. Cl.
*H01R 12/00* (2006.01)

(52) U.S. Cl. .......................... 439/55; 439/68; 361/780; 174/260

(58) Field of Classification Search ................. 439/55, 439/60, 68, 69, 70; 361/780, 792; 174/260, 174/264
See application file for complete search history.

(56) References Cited

U.S. PATENT DOCUMENTS

| 6,991,470 | B2 * | 1/2006 | Muench ........................ 439/55 |
| 7,149,092 | B2 * | 12/2006 | Iguchi ........................ 361/780 |
| 2002/0086561 | A1 * | 7/2002 | Ogawa et al. ................. 439/55 |
| 2003/0053302 | A1 * | 3/2003 | Kelly et al. .................. 361/780 |
| 2003/0063453 | A1 * | 4/2003 | Kusagaya et al. ........... 361/794 |
| 2004/0125580 | A1 * | 7/2004 | Chung et al. ................ 361/794 |

* cited by examiner

*Primary Examiner*—Hien Vu
(74) *Attorney, Agent, or Firm*—Workman Nydegger

(57) ABSTRACT

The invention relates to an electrical printed circuit board serving for electrical contact-connection of an integrated circuit. The printed circuit board has a dielectric forming the printed circuit board material; at least one ground inner layer connected to ground potential; and a supply voltage inner layer connected to the potential of the supply voltage. The invention further includes at least one locally formed inner layer electrically connected to the supply voltage inner layer; a first external terminal contact serving for electrical connection to a ground terminal of an integrated circuit; and a second external terminal contact serving for electrical connection to a supply voltage terminal of an integrated circuit. In addition, a first contact-connection is provided between the first external terminal contact and the at least one ground inner layer; and a second contact-connection is provided between the second external terminal contact and the at least one locally formed inner layer. The at least one locally formed inner layer and the at least one ground inner layer provide a printed circuit board decoupling capacitor for an integrated circuit.

15 Claims, 3 Drawing Sheets

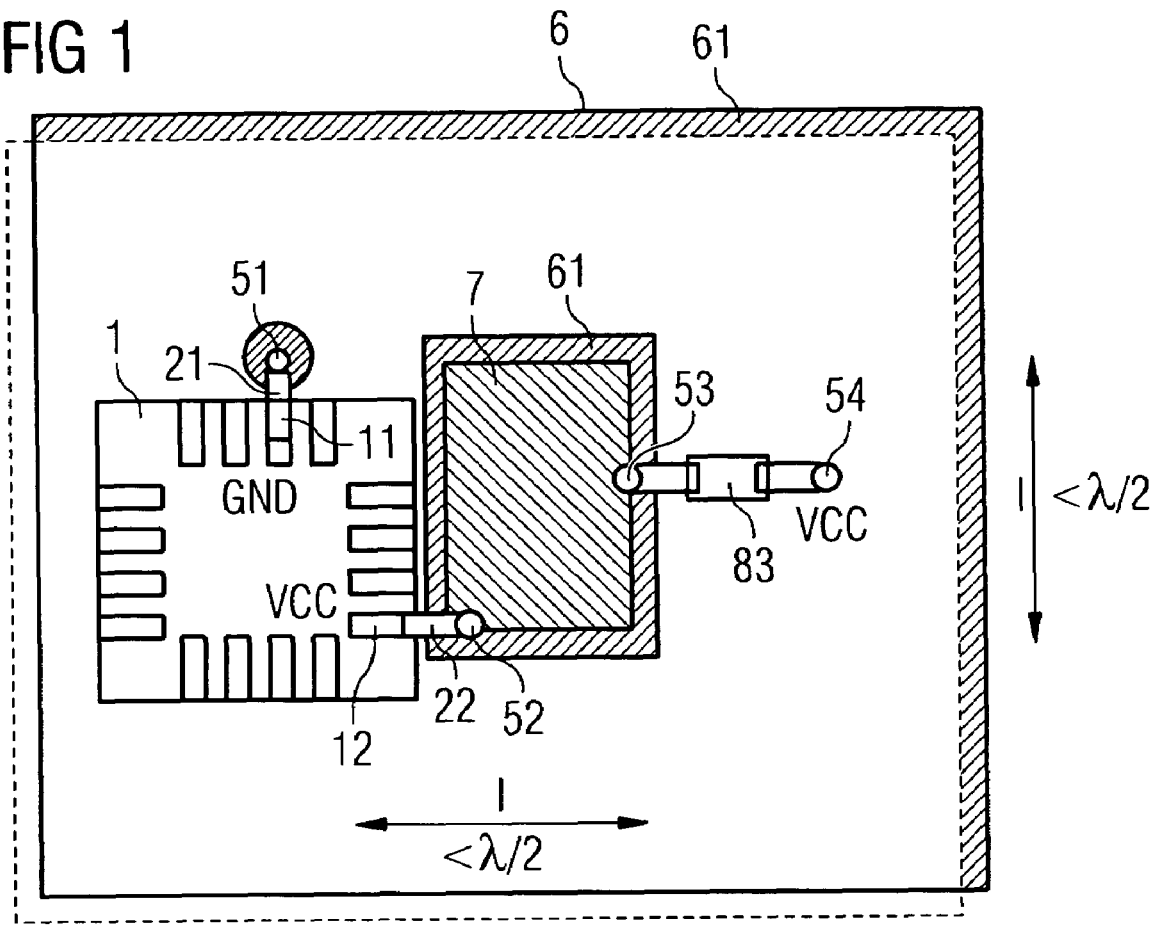
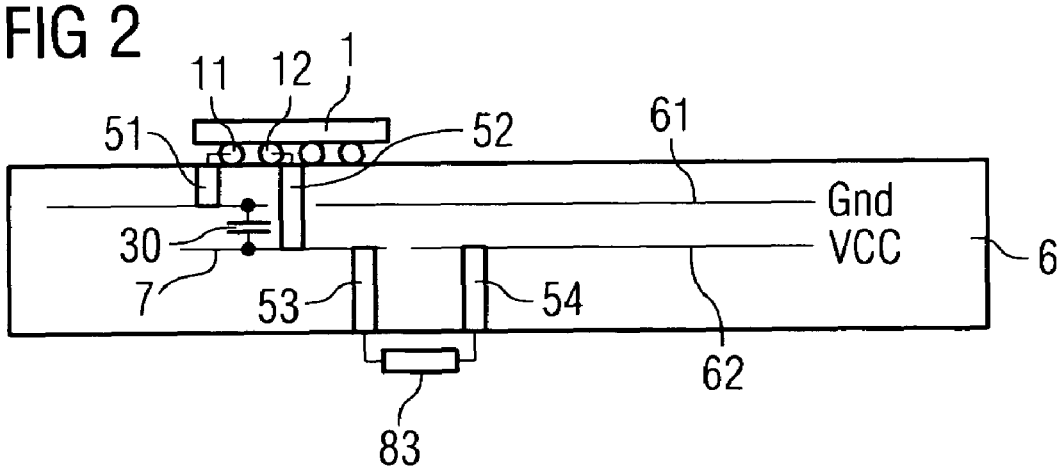

ELECTRICAL PRINTED CIRCUIT BOARD

FIELD OF THE INVENTION

The invention relates to an electrical printed circuit board serving for electrical contact-connection of an integrated circuit (IC). In particular, the invention relates to an electrical printed circuit board which provides a low-impedance DC decoupling between the ground terminal and the supply voltage terminal of an IC.

BACKGROUND OF THE INVENTION

It is known to use a capacitance arranged between the ground terminal and the supply terminal for a low-impedance DC decoupling between the ground and the supply voltage of an integrated circuit (IC) arranged on a printed circuit board. Such a capacitance may generally be provided either by capacitors arranged in discrete fashion on the printed circuit board or by plate capacitors formed by inner layers of the printed circuit board. Such inner layers are, in particular, a printed circuit board layer connected to ground (GND) and a printed circuit board layer connected to the operating voltage (Vcc). The latter is also referred to as supply layer.

If an IC is "served" from the supply layers of the printed circuit board and draws current for its supply, then this may adversely affect the emission properties of the printed circuit board insofar as a radiofrequency interference corresponding to radiofrequency components of the current drawn by the IC may be transferred over large parts of the printed circuit board. At high frequencies of greater than 2 GHz, a structural resonance may be excited even in the case of relatively small module printed circuit boards of the 50×10 mm$^2$ type.

For better illustration, the printed circuit board may in this case be regarded as a low-impedance waveguide. If the inner layer plate capacitor is in parallel with discrete decoupling capacitors, then the IC is served firstly from the inner layers, since the capacitor formed by the inner layers typically has a smaller parasitic inductance and thus a lower RF impedance.

Therefore, it has proved to be advantageous for reasons of electromagnetic compatibility (EMV) to place a decoupling capacitor directly between the supply pin and the ground pin of an IC. Such a configuration is illustrated in FIGS. 5 and 6. A chip 1 having a multiplicity of electrical terminal pins 10 is placed onto the surface of a printed circuit board 6. Two of the contact pins of the chip 1 are the ground pin 11 and the supply pin 12. These are connected to inner layers 61, 62 of the printed circuit board 6 via electrical lines 21, 22 on the surface of the printed circuit board 6 and by means of plated-through holes 51, 52. One inner layer 62 has the potential Vcc in this case. The other inner layer 61 is connected to ground GND.

A decoupling capacitor 3 is placed between the lines 21, 22 and thus directly between the ground pin 11 and the supply pin 12. It is furthermore provided that the connection to the inner layers 61, 62 of the printed circuit board 6 is effected via lossy ferritic coils 81, 82 (so-called "ferrite beads"). Ferrite beads comprise a wire generally made of copper or aluminum that is embedded in a ferritic material. They constitute frequency-dependent resistors which, at a specific frequency, are in resonance and, in resonance, have a purely real resistance usually of a few hundred Ohms. The DC resistance is very small. Ferrite beads are known per se.

In the case of the configuration illustrated in FIGS. 5 and 6, the chip 1 draws the radiofrequency components of its current supply from the decoupling capacitor 3 (and not from the inner layer plate capacitor of the printed circuit board 6), with the result that the radiofrequency components can be kept away from the printed circuit board 6 and cannot lead to structural resonances there. In this case, the arrangement acts as a filter of the supply voltage drawn, only the low-frequency components being transmitted toward the printed circuit board 6.

The construction illustrated in FIGS. 5 and 6 is practicable, however, only when the terminal pins of the IC to be decoupled enable a direct decoupling. However, many of the modern ICs have pin-outs that do not enable a decoupling in accordance with FIGS. 5 and 6. By way of example, BGA housings are designed in such a way that a disentanglement is provided in inner layers. QFN housings constitute another example, in the case of which the Vcc pin and the GND pin are spatially very far away from one another. If it is attempted to decouple such ICs as described, then a conductor loop several millimeters in length arises for technical layout reasons. This situation is illustrated in FIG. 7. A corresponding conductor loop 23 has a parasitic inductance of several nH in the decoupling path. The consequence of this is that impedances of greater than 30 ohms occur at frequencies of greater than 2 GHz, with the result that the decoupling capacitor can no longer be used effectively: the high impedance prevents the IC from being able to be supplied effectively by means of the decoupling capacitor with regard to the radiofrequency components of its current supply.

There is a need for simple, efficient and diversely useable printed circuit boards and arrangements in which ICs arranged on printed circuit boards have a low-impedance DC decoupling between the ground terminal and the supply voltage terminal.

SUMMARY OF THE INVENTION

The invention provides an electrical printed circuit, having: a dielectric forming the printed circuit board material, at least one ground inner layer connected to ground potential, a supply voltage inner layer connected to the potential of the supply voltage, at least one locally formed inner layer electrically connected to the supply voltage inner layer, a first external terminal contact serving for electrical connection to a ground terminal of an integrated circuit, a second external terminal contact serving for electrical connection to a supply voltage terminal of an integrated circuit, a first contact-connection between the first external terminal contact and the at least one ground inner layer, a second contact-connection between the second external terminal contact and the at least one locally formed inner layer. The at least one locally formed inner layer and the at least one ground inner layer provide a printed circuit board decoupling capacitor for an integrated circuit.

In this case, the first and second contact-connections are preferably formed in each case as a plated-through hole. An integrated circuit is arranged on the printed circuit board according to the invention in such a way that the first external terminal contact is electrically connected to the ground terminal and the second external terminal contact is electrically connected to the supply voltage terminal of the integrated circuit. Via the plated-through holes, the ground terminal and the supply voltage terminal of the integrated circuit are connected to the respective inner layers of the printed circuit board decoupling capacitor, with the result that the latter is placed directly between ground terminal and supply voltage terminal.

The invention is based on the concept of realizing a decoupling capacitor by means of inner layers of a printed circuit board, the printed circuit board, for this purpose, having one or a plurality of locally formed inner layers which are at the potential of the supply voltage and which are also referred to hereinafter as "island" or "supply voltage island". In this case, the locally formed inner layer or island is preferably directly electrically insulated from the other inner layers. Only a connection to the supply voltage inner layer is present, which is preferably effected via a resistor arranged on an outer layer of the printed circuit board. Said resistor is preferably a ferritic frequency-dependent resistor, in particular one or a plurality of ferrite beads. However, the resistor may also be formed as a coil or as a nonreactive resistor.

Moving the decoupling capacitor into inner layers of the printed circuit board enables a significantly greater freedom in the spatial arrangement of the corresponding pins on the integrated circuit. In this case, the IC pins can be directly connected via plated-through holes to the corresponding layers of the printed circuit board decoupling capacitor. In this case, the printed circuit board capacitor is preferably formed in a manner directly adjoining or below the IC in the printed circuit board. Conductor loops in the decoupling path which lead to undesirable parasitic inductances are avoided.

It should be noted in respect of the dimensioning of the locally formed inner layer that the inner layer preferably has a length which is at most equal to half the wavelength which corresponds to the frequency of the maximum interference voltage which is expected during operation of an integrated circuit connected on the printed circuit board. Said wavelength corresponds precisely to the frequency of the first resonance of the locally formed layer. At longer lengths, the arrangement becomes electrically unstable and an increased emission of electromagnetic interference radiation takes place, which is precisely to be avoided.

If the locally formed inner layer has an essentially rectangular form, the maximum side length of the locally formed inner layer is calculated according to the following formula:

$$l_{max} = 1/2 * \lambda_{max} = 1/2 * (c/f_{max}) * (\mu_r \epsilon_r^{-1/2}) \quad (1)$$

In this case, c=speed of light; $\lambda_{max}$=longest wavelength expected in the dielectric of the printed circuit board; $\epsilon_r$=the dielectric constant of the printed circuit board dielectric, and $\mu_r$=relative permeability of the printed circuit board dielectric. The following furthermore holds true for $f_{max}$:

$$f_{max} = 8*f_0 \text{ if } f_0 \leq 1 \text{ GHz} \quad (2)$$

$$f_{max} = 4*f_0 \text{ if } f_0 > 1 \text{ GHz} \quad (3)$$

In this case, $f_0$ denotes the 1$^{st}$ harmonic (fundamental frequency) of an integrated circuit arranged on the printed circuit board.

An example will elucidate the above formula. A data rate of 10 Gbit/s of the integrated circuit shall be assumed. This corresponds to an oscillation frequency $f_0$ of 5 GHz. An FR4 printed circuit board shall furthermore be considered, in the case of which $\epsilon_r$=4 and $\mu_r$=1.

It follows from (1) and (3) that:

$$l_{max} = 1/2 * \lambda_{max} = 1/2(c/4*f_0)*(4^{-1/2}) =$$
$$1/2*(3*10^8 \text{m/s}/4*5*10^9 \text{Hz})*(4^{-1/2}) = 3.75 \text{ mm}$$

The fact that $f_{max}$ to a very good approximation is set to be equal to $8*f_0$ for frequencies of less than or equal to 1 GHz and to be equal to $4*f_0$ for frequencies of greater than 1 GHz results from the fact that, at the respective frequencies, the 8$^{th}$ harmonic oscillation and the 4$^{th}$ harmonic oscillation respectively represent the highest relevant interference frequency.

Harmonics greater than the 8$^{th}$ harmonic oscillation are also possible depending on the dielectrics used and on the structure size (for example in the sub-cm range).

In a further preferred configuration of the invention, measures are provided for increasing the capacitance of the printed circuit board decoupling capacitor. For this purpose, in one configuration, the locally formed inner layer is assigned a plurality of ground inner layers as reference layers. In another configuration, a plurality of locally formed inner layers are provided, which are connected to one another via plated-through holes. In this case, the plurality of locally formed inner layers are preferably assigned a plurality of ground inner layers as reference layers.

BRIEF DESCRIPTION OF THE DRAWINGS

The invention is explained in more detail below on the basis of a plurality of exemplary embodiments with reference to the figures of the drawing, in which:

FIG. 1 shows a plan view of a first configuration of a printed circuit board on which an IC chip is arranged, with individual layers of the printed circuit board being illustrated.

FIG. 2 schematically shows a lateral sectional view of the printed circuit board of FIG. 1;

DESCRIPTION OF A PLURALITY OF PREFERRED EXEMPLARY EMBODIMENTS

Figure 5:
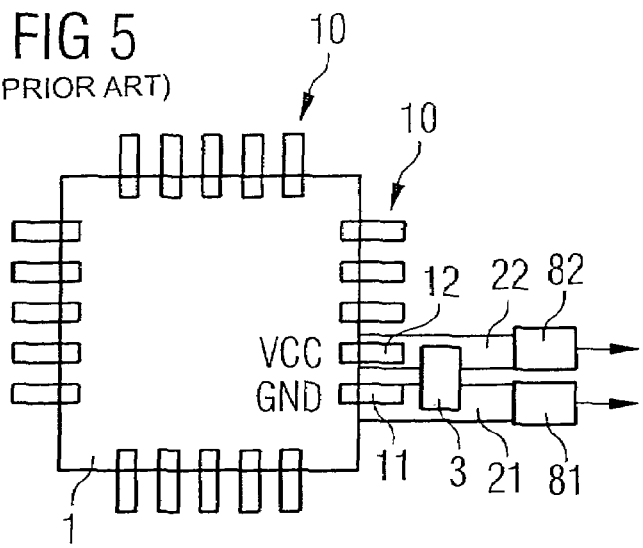
FIG. 5 shows a printed circuit board with IC chip arranged thereon with decoupling by means of a decoupling capacitor in accordance with the prior art.
Figure 6:
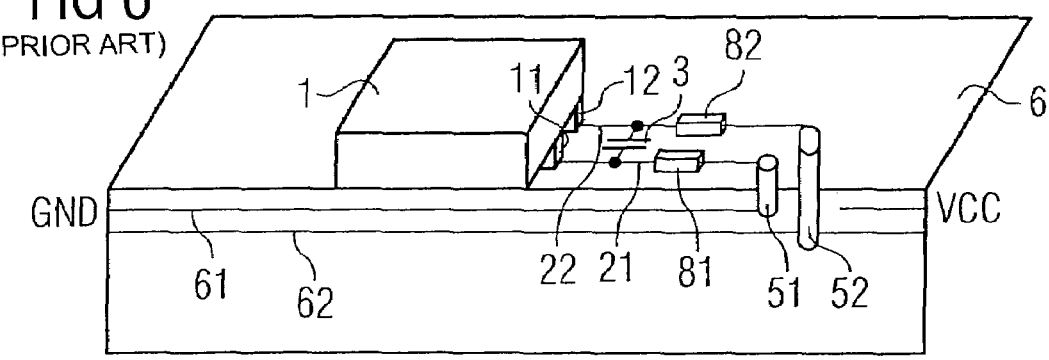
FIG. 6 shows a perspective, partially sectional view of the arrangement of FIG. 5.
Figure 7:
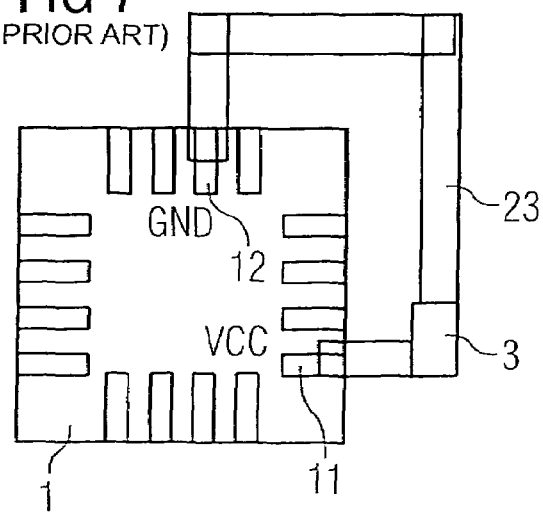
FIG. 7 shows an IC chip whose ground pin and supply pin are arranged in such a way that a decoupling corresponding to the arrangement of FIGS. 5 and 6 is not possible.

The prior art and the disadvantages thereof have been explained in the introduction with reference to FIGS. 5 to 7.

FIGS. 1 and 2 show an arrangement with a printed circuit board 6 and an integrated circuit 1. The printed circuit board 6 has a ground inner layer (ground layer) 61 connected to ground (GND), and a supply voltage inner layer (supply layer) 62 connected to the operating voltage Vcc. Moreover, a region 7 is provided locally, which region is likewise connected to the operating voltage Vcc but is directly electrically insulated from the supply layer 62. This region 7 is also referred to hereinafter as insulated supply layer island or Vcc island 7. The insulated VCC island 7 is connected to the supply layer 62 of the printed circuit board 6 via two plated-through holes 53, 54 and a ferritic coil 83 (ferrite bead) arranged on the lower surface of the printed circuit board 6. Instead of a ferritic coil, it is also possible as an alternative to use a normal coil or a nonreactive resistor.

The IC 1 formed as prefabricated chip, also referred to hereinafter as chip, has two terminal pins 11, 12 for ground (GND) and for the supply voltage (Vcc). The terminal pins 11, 12 may be provided for example by projecting pins or by contact areas on the underside of the chip 1. The ground pin 11 is connected to the ground inner layer 61 of the printed circuit board arrangement 6, via a short electrical line 21 and a plated-through hole 51. The supply pin 12 is connected to the VCC island 7 via a short electrical line 22 and a plated-through hole 52. If the plated-through holes 51, 52 are arranged directly below the terminal pins 11, 12, the electrical lines can also be dispensed with. The ends of the electrical lines 21, 22 arranged on the top side of the printed circuit board 6 or the outer ends of the plated-through holes 51, 52 form first and second external electrical terminal contacts for contact-connection of the terminal pins 11, 12 of the chip 1.

The VCC island 7 is preferably positioned spatially close below, in front of or between the corresponding terminal pins 11, 12 of the IC 1.

The lateral distance between the VCC island 7 and the supply layer 62 is preferably approximately equal to twenty times the thickness of the dielectric between the supply layer 62 and the ground inner layer 61 adjacent thereto.

The functioning of the arrangement is such that the VCC island 7 and the ground inner layer 61 form a decoupling capacitor. The latter is represented—merely symbolically and for illustration—as decoupling capacitor 30. The reference numeral 30 therefore does not designate a capacitor that is actually present. The decoupling capacitor is formed solely by the inner layers 7, 61.

The decoupling capacitor is arranged directly in front of the chip 1, cf. FIG. 1. The chip 1 is served in the case of its supply with regard to the radiofrequency components of this capacitor, with the result that no radiofrequency interference can be transmitted to the supply layer 62 of the printed circuit board 6. The supply layer 62 is connected to the VCC island 7 via the plated-through holes 53, 54 and also ferrite beads 83, but it is decoupled from said island with regard to radiofrequency interference.

The chip 1 is thus supplied by means of a decoupling capacitor comprising a ground layer 61 and a directly electrically insulated island 7 in the inner layers of the printed circuit board 6. One or a plurality of directly electrically insulated islands 7 may be provided in this case.

For the dimensioning of the insulated island 7, it should be taken into consideration that the longitudinal edges 1 of the island 7, which is formed in rectangular fashion in the exemplary embodiment, should not be longer than half the wavelength of the maximum interference voltage which is to be expected in the dielectric of the printed circuit board during operation of an integrated circuit. For this is the frequency of the first resonance of the supply layer island 7, at which the structure is no longer adequately described by a plate capacitor.

An example will now be given for the capacitance of the printed circuit board decoupling capacitor.

It has already been calculated that, given a data rate of 10 Gbit/s and an FR4 board, the maximum edge length 1 of the Vcc island 7 is 3.75 mm. If a typical layer distance d of 60 μm is furthermore assumed, then the following results according to the known formula:

$$C = (\epsilon_0 * \epsilon_r * A/d) = (8.85e-12 * 4 * 3.75^2 * 10^{-6})/60 * 10^{-6} = 8.1 \text{ pF}$$

The achievable decoupling capacitance of an island 7 having a length of 3.75 mm, a single reference plane and typical layer distance of 60 μm is thus 8.1 pF.

This value may, if necessary, be increased by the addition of a second or a plurality of further reference planes and/or by providing a plurality of Vcc islands 7. Exemplary embodiments in this respect are illustrated in FIGS. 3 and 4.

Figure 3:
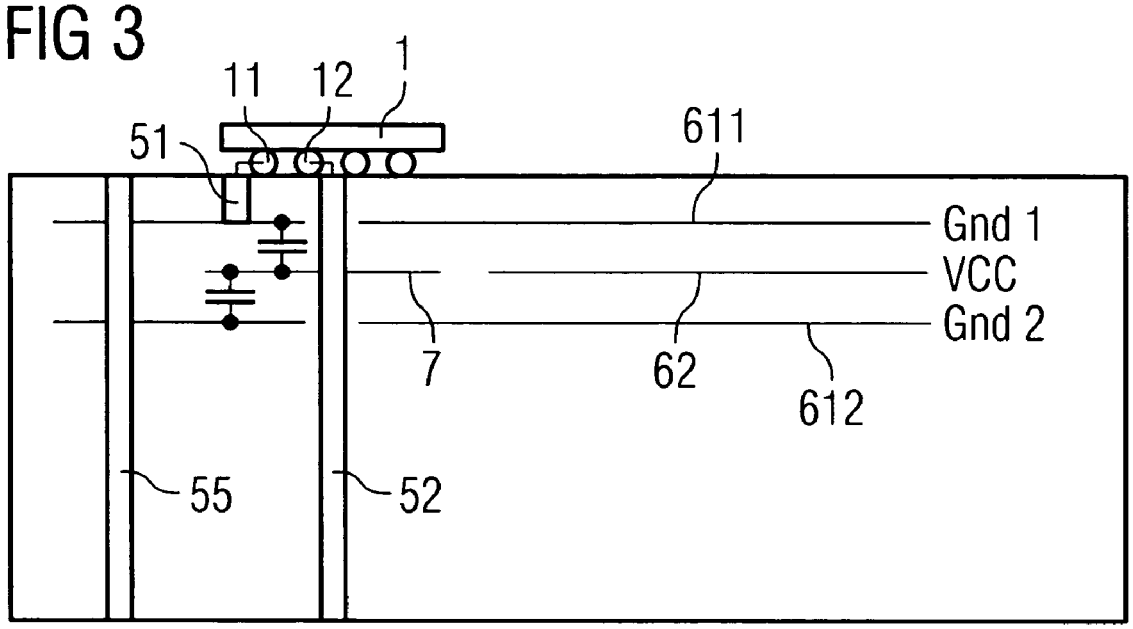
FIG. 3 schematically shows a lateral sectional view of a second exemplary embodiment of a printed circuit board.

In the case of FIG. 3, the Vcc ground layer 62 and also the Vcc supply island 7 are placed between two ground layers 611, 612. In this case, an additional plated-through hole 55 connects the upper ground layer 611 and the lower ground layer 612, so that these are at the same potential. This arrangement increases the capacitance of the capacitance formed by the VCC island 7 and the ground layers 611, 612.

Figure 4:
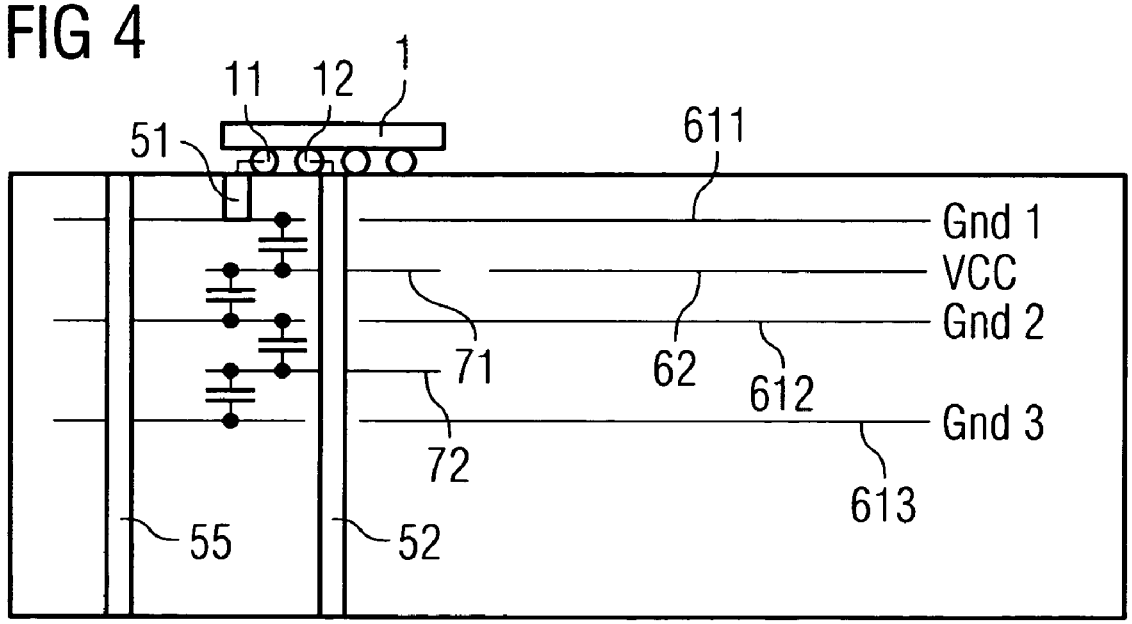
FIG. 4 schematically shows a lateral sectional view of a third exemplary embodiment of a printed circuit board.

The configuration of FIG. 4 is provided with two Vcc supply islands 71, 72 arranged between three ground layers 611, 612, 613. A plated-through hole 55 connects the three ground layers 611, 612, 613. The plated-through hole 52 connects the VCC supply islands 71, 72 to one another and to the corresponding supply pin 12 of the chip 1. This arrangement further increases the capacitance of the capacitor formed in the printed circuit board 6.

It is pointed out that, both in the case of the configuration of FIG. 3 and of the configuration of FIG. 4, the supply island 7 and the plurality of supply islands 71, 72 are connected to the Vcc supply layer 62 via further plated-through holes and ferrite beads in the same way as in the configuration of FIGS. 1 and 2. This is not illustrated separately in FIGS. 3 and 4 in order to improve the clarity of the illustration. It is furthermore pointed out that the capacitors depicted are again to be understood merely symbolically.

The embodiment of the invention is not restricted to the exemplary embodiment illustrated above. The person skilled in the art recognizes that numerous alternative embodiment variants exist which, despite their deviation from the exemplary embodiments described, make use of the teaching defined in the subsequent claims.

The invention claimed is:

1. An electrical printed circuit board arrangement configured for connection to an integrated circuit, comprising:
   a printed circuit board comprising a dielectric material;
   at least one ground inner layer extending within the printed circuit board, and configured to connect to a ground potential;
   a supply voltage inner layer extending within the printed circuit board, and configured to connect to a supply voltage potential;
   at least one locally formed inner layer extending within the printed circuit board and physically isolated from the supply voltage inner layer, but electrically connected thereto;
   a first external terminal contact on the printed circuit board surface, the first external terminal contact being configured to provide electrical connection to a ground terminal of the integrated circuit when the integrated circuit is mounted on the printed circuit board surface;
   a second external terminal contact on the printed circuit board surface, the second external terminal contact being configured to provide electrical connection to a supply voltage terminal of the integrated circuit when the integrated circuit is mounted on the printed circuit board surface;

a first contact-connection arranged below the integrated circuit when the integrated circuit is mounted on the printed circuit board surface, and the first contact-connection extending generally vertically through a portion of the printed circuit board between the first external terminal contact and the at least one ground inner layer; and a second contact-connection arranged below the integrated circuit when the integrated circuit is mounted on the printed circuit board surface, and the second contact-connection extending generally vertically through a portion of the printed circuit board between the second external terminal contact and the at least one locally formed inner layer, wherein the at least one locally formed inner layer and the at least one ground inner layer are spatially positioned with respect to one another to form a printed circuit board decoupling capacitor for the integrated circuit, the decoupling capacitor being located within the printed circuit board and being electrically connected across the first and second contact-connections.

2. The arrangement of claim 1, wherein the at least one locally formed inner layer is laterally electrically insulated from the supply voltage inner layer extending within the printed circuit board.

3. The arrangement of claim 1, wherein the at least one locally formed inner layer is electrically connected to the supply voltage inner layer via a resistor arranged on a surface of the printed circuit board.

4. The arrangement of claim 3, wherein the resistor comprises at least one frequency-dependent resistor.

5. The arrangement of claim 4, wherein the frequency-dependent resistor comprises at least one ferritic frequency-dependent resistor.

6. The arrangement of claim 4, wherein the frequency-dependent resistor comprises at least one coil.

7. The arrangement of claim 3, wherein the resistor comprises a non-reactive resistor.

8. The arrangement of claim 1, wherein a length associated with the at least one locally formed inner layer is less than or equal to half the wavelength that corresponds to a maximum frequency of an interference voltage that is expected in the dielectric during operation of the integrated circuit.

9. The arrangement of claim 8, wherein the at least one locally formed inner layer comprises a rectangular form and a maximum side length follows the formula:

$$l_{max} = \tfrac{1}{2} * \lambda_{max} = \tfrac{1}{2} * (C/f_{max}) * (\mu_r \epsilon_r^{-1/2}),\text{ wherein}$$

c=speed of light;

$\lambda_{max}$=longest wavelength expected in the dielectric of the printed circuit board;

$\epsilon_r$=the dielectric constant of the dielectric, $\mu_r$=relative permeability of the dielectric, wherein $$f_{max} = 8 * f_0,\text{ if } f_0 \leq 1\text{ GHz},$$

$$f_{max} = 4 * f_0,\text{ if } f_0 > 1\text{ GHz},$$

and wherein $f_0$ is equal to the first harmonic of the integrated circuit that is arranged on the printed circuit board.

10. An printed circuit board arrangement configured for connection to an integrated circuit, comprising:

a printed circuit board dielectric material;

a ground inner layer extending laterally within the printed circuit board at a first depth from a top surface of the printed circuit board, and configured to connect to a ground potential;

a supply voltage inner layer extending laterally within the printed circuit board at a second depth from the top surface of the printed circuit board, wherein the second depth is not equal to the first depth, and the supply voltage inner layer is configured to connect to a supply voltage potential;

a locally formed inner layer extending laterally within the printed circuit board at the second depth, wherein the locally formed inner layer and the supply voltage inner layer are physically laterally isolated from one another with printed circuit board dielectric material therebetween;

a first external terminal contact on the top surface of the printed circuit board, the first external terminal contact configured to provide electrical connection to a ground terminal of the integrated circuit when the integrated circuit is mounted on the top surface of the printed circuit board;

a second external terminal contact on the top surface of the printed circuit board, configured to provide electrical connection to a supply voltage terminal of the integrated circuit when the integrated circuit is mounted on the top surface of the printed circuit board;

a first contact connection arranged below the integrated circuit when the integrated circuit is mounted on the printed circuit board surface, and the first contact-connection extending generally vertically through the printed circuit board between the first external terminal contact and the ground inner layer; and a second contact connection arranged below the integrated circuit when the integrated circuit is mounted on the printed circuit board surface, and the second contact-connection extending generally vertically through the printed circuit board between the second external terminal contact and the locally formed inner layer; and an electrical coupling between the locally formed inner layer and the supply voltage inner layer at a depth not equal to the second depth, wherein the ground inner layer and the locally formed inner layer spatially overlap one another in the printed circuit board material, thereby forming a decoupling capacitor for the integrated circuit when the integrated circuit is mounted on the top surface of the printed circuit board, the decoupling capacitor being located within the printed circuit board and being electrically connected across the first and second contact connections.

11. The printed circuit board arrangement of claim 10, wherein the electrical coupling comprises a resistance residing on a top surface or a bottom surface of the printed circuit board, and electrical contacts extending generally vertically through the printed circuit board material to contact the locally formed inner layer and the supply voltage inner layer, respectively.

12. The printed circuit board arrangement of claim 11, wherein the resistance comprises a ferrite bead.

13. The printed circuit board arrangement of claim 11, wherein the resistance comprises a frequency dependent resistor.

14. The printed circuit board arrangement of claim 10, wherein the locally formed inner layer comprises a rectangular shape, and wherein a length of a longest side thereof is less than or equal to $\lambda/2$, wherein $\lambda$ is the longest wavelength expected in the printed circuit board material.

15. The printed circuit board arrangement of claim 10, wherein a lateral distance between the supply voltage inner layer and the locally formed inner layer is about 20 or more times a distance between the supply voltage inner layer and the ground inner layer.

* * * * *

UNITED STATES PATENT AND TRADEMARK OFFICE
CERTIFICATE OF CORRECTION

PATENT NO.      : 7,306,466 B2
APPLICATION NO. : 11/009640
DATED           : December 11, 2007
INVENTOR(S)     : Reznik et al.

It is certified that error appears in the above-identified patent and that said Letters Patent is hereby corrected as shown below:

Drawings
Figure 7, replace the figure with the figure herein depicted wherein the references 11 and 12 have been switched.

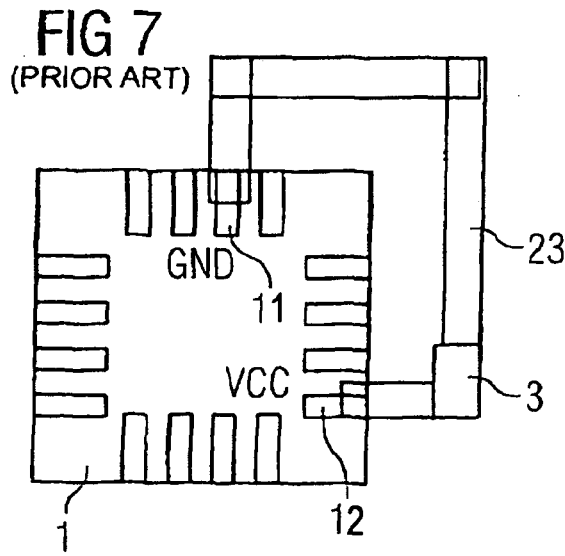

Column 1
Line 25, change "supply layer" to --a supply layer--
Line 66, change "Ohms" to --ohms--

Column 5
Line 7, change "as prefabricated" to --as a prefabricated--

Column 6
Line 13, change "Vcc ground layer" to --Vcc supply layer--

Signed and Sealed this

Twenty-third Day of November, 2010

David J. Kappos
*Director of the United States Patent and Trademark Office*

Column 7
Line 53, Claim 9, change "(C/fmax)" to --(c/fmax)--